United States Patent
Tokita et al.

[11] Patent Number: 5,959,304
[45] Date of Patent: Sep. 28, 1999

[54] SEMICONDUCTOR EXPOSURE APPARATUS

[75] Inventors: Toshinobu Tokita; Yuji Chiba; Yutaka Tanaka, all of Utsunomiya, Japan

[73] Assignee: Canon Kabushiki Kaisha, Tokyo, Japan

[21] Appl. No.: 09/080,397

[22] Filed: May 18, 1998

[30] Foreign Application Priority Data

May 19, 1997 [JP] Japan .................................. 9-142982

[51] Int. Cl.⁶ .................................................. G21K 5/00
[52] U.S. Cl. ........................................... 250/492.2; 378/34
[58] Field of Search .................... 750/492.2, 492.22, 750/491.1; 378/34, 35

[56] References Cited

U.S. PATENT DOCUMENTS

| | | | |
|---|---|---|---|
| 4,385,434 | 5/1983 | Zehnpfennig et al. | 29/576 B |
| 4,475,223 | 10/1984 | Taniguchi et al. | 378/34 |
| 4,648,106 | 3/1987 | Novak | 378/34 |
| 5,112,133 | 5/1992 | Kurosawa et al. | 356/401 |
| 5,123,036 | 6/1992 | Uno et al. | 378/34 |
| 5,125,014 | 6/1992 | Watanabe et al. | 378/34 |
| 5,134,640 | 7/1992 | Hirokawa et al. | 378/34 |
| 5,172,402 | 12/1992 | Mizusawa et al. | 378/34 |
| 5,285,488 | 2/1994 | Watanabe et al. | 378/34 |
| 5,317,615 | 5/1994 | Ebinuma et al. | 378/34 |
| 5,333,167 | 7/1994 | Iizuka et al. | 378/35 |
| 5,347,561 | 9/1994 | Ebinuma | 378/34 |
| 5,377,251 | 12/1994 | Mizusawa et al. | 378/34 |
| 5,398,271 | 3/1995 | Nishida et al. | 378/34 |
| 5,600,698 | 2/1997 | Terashima et al. | 378/34 |
| 5,604,779 | 2/1997 | Amemiya et al. | 378/34 |

FOREIGN PATENT DOCUMENTS

2-100311  4/1990  Japan .
3-120712  5/1991  Japan .

*Primary Examiner*—Kiet T. Nguyen
*Attorney, Agent, or Firm*—Fitzpatrick, Cella, Harper & Scinto

[57] ABSTRACT

An exposure apparatus for transferring a pattern, formed on a membrane of a mask, to an exposure region of a wafer disposed opposed to the mask with a small spacing kept therebetween. The apparatus includes an exposure system for transferring, by exposure, the pattern of the mask to different exposure regions of the wafer sequentially, a measuring system for producing deformation information related to at least one portion of the mask membrane, and an attitude controlling system for controlling attitude of at least one of the mask and the wafer, on the basis of the deformation information produced by the measuring system.

7 Claims, 8 Drawing Sheets

SEMICONDUCTOR EXPOSURE APPARATUS

FIELD OF THE INVENTION AND RELATED ART

This invention relates to a semiconductor exposure apparatus for transferring and forming, by exposure, a fine pattern of a semiconductor integrated circuit provided on a mask, onto a wafer. More particularly, the invention is concerned with a proximity exposure apparatus wherein exposure is performed while a mask and a wafer are held in proximity to each other with a small gap.

A typical example of such a proximity exposure apparatus is an X-ray exposure apparatus. Japanese Laid-Open Patent Application, Laid-Open No. 100311/1990 shows an example of an X-ray exposure apparatus wherein a synchrotron radiation light source is used.

Figure 1:
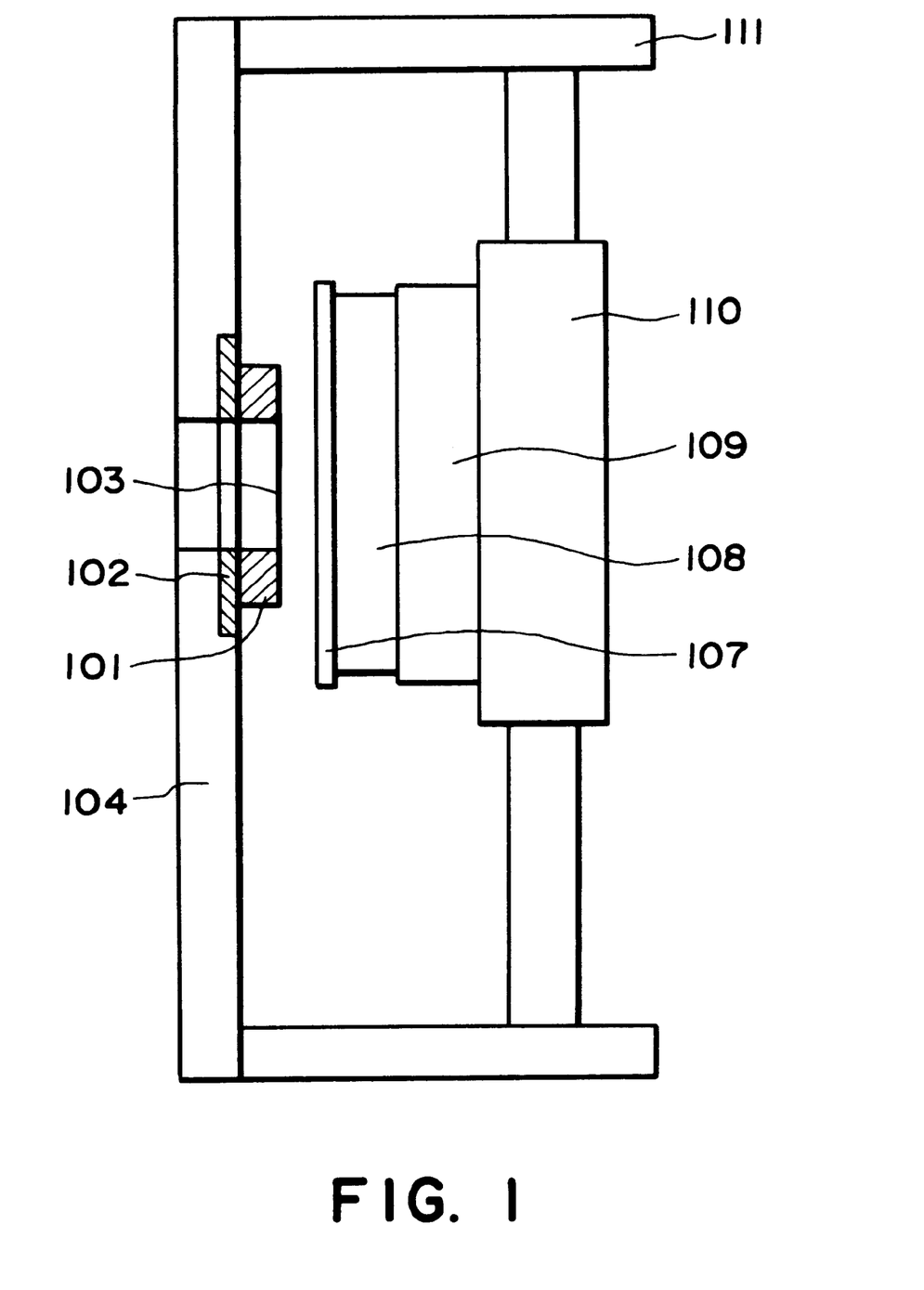
FIG. 1 is a schematic view for explaining a conventional X-ray exposure apparatus.

FIG. 1 shows a conventional structure of an X-ray exposure apparatus. Denoted in FIG. 1 at 101 is a mask, and denoted at 102 is a mask chuck for holding the mask. Denoted at 103 is a mask membrane, and denoted at 104 is a mask chuck base. Denoted at 107 is a wafer, and denoted at 108 is a wafer chuck for holding the wafer. Denoted at 109 is a fine-motion stage to be used for alignment between the mask and the wafer, and denoted at 110 is a rough-motion stage to be used for movement for changing shots. Denoted at 111 is a stage base with which the guiding for the rough-motion stage is fixed. The wafer 107 and the wafer chuck 108 are mounted on the fine-motion stage 109.

Generally, in X-ray exposure apparatuses, the exposure process is performed in accordance with a step-and-repeat method wherein a pattern of a mask is printed on different exposure regions (shots) on a wafer sequentially, and also in accordance with a proximity method wherein the mask and the wafer are disposed opposed to each other with a gap of about 10–50 microns kept therebetween.

Further, in X-ray masks, the portion where an absorptive material pattern is formed is provided by a thin film (hereinafter "membrane") of a thickness of about 2 microns.

The procedure of exposure according to a die-by-die method in an X-ray exposure apparatus will be such as follows:

Step 1: Rough-motion stage 110 is actuated so that a portion of the wafer 107 for exposure of the n-th shot is placed below the mask membrane 103.

Step 2: Fine-motion stage 109 is actuated to move and position the wafer 107 so that the spacing (gap) between the mask and the wafer is changed from a gap (e.g., 100 microns) for stepwise motion to a gap (e.g., 70 microns) for gap measurement (autofocus measurement), and subsequently the autofocus measurement is performed. Usually, the gap for stepwise motion is sufficiently wide.

Step 3: After paralelling the mask 101 and the wafer 107 through the fine-motion stage 109, gap setting is performed for execution of measurement of positional deviation (autoalignment measurement) between the mask and the wafer along the surface thereof, and then autoalignment measurement is performed.

Step 4: The mask-to-wafer alignment is executed, and exposure is performed.

Step 5: The gap is changed back to the gap for stepwise motion.

Step 6: The operation of Step 1 to Step 5 is repeated.

In proximity exposure apparatuses, closing motion and retracting motion between a mask and a wafer are repeated with respect to every exposure. This is a bar to increasing the throughput. For improved throughput, it is desirable to execute wafer stage stepwise motion without carrying out the closing motion and retracting motion between the mask and the wafer. Since, however, the mask and the wafer are disposed close to each other with a small spacing (several tens of microns), if there is a relative angular difference between the mask and the wafer, the mask membrane will be deformed at the time of wafer stage stepwise motion. Such deformation of the mask membrane will cause deterioration of the mask-to-wafer alignment precision and of transfer precision. If a delay is set until mask membrane deformation is attenuated, it causes a decrease of throughput.

SUMMARY OF THE INVENTION

It is an object of the present invention to provide a semiconductor exposure apparatus by which deformation of a mask membrane. during stepwise motion is suppressed within a tolerable range, such that high mask-to-wafer alignment precision as well as high transfer precision are assured and also that a high throughput is assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 2A:
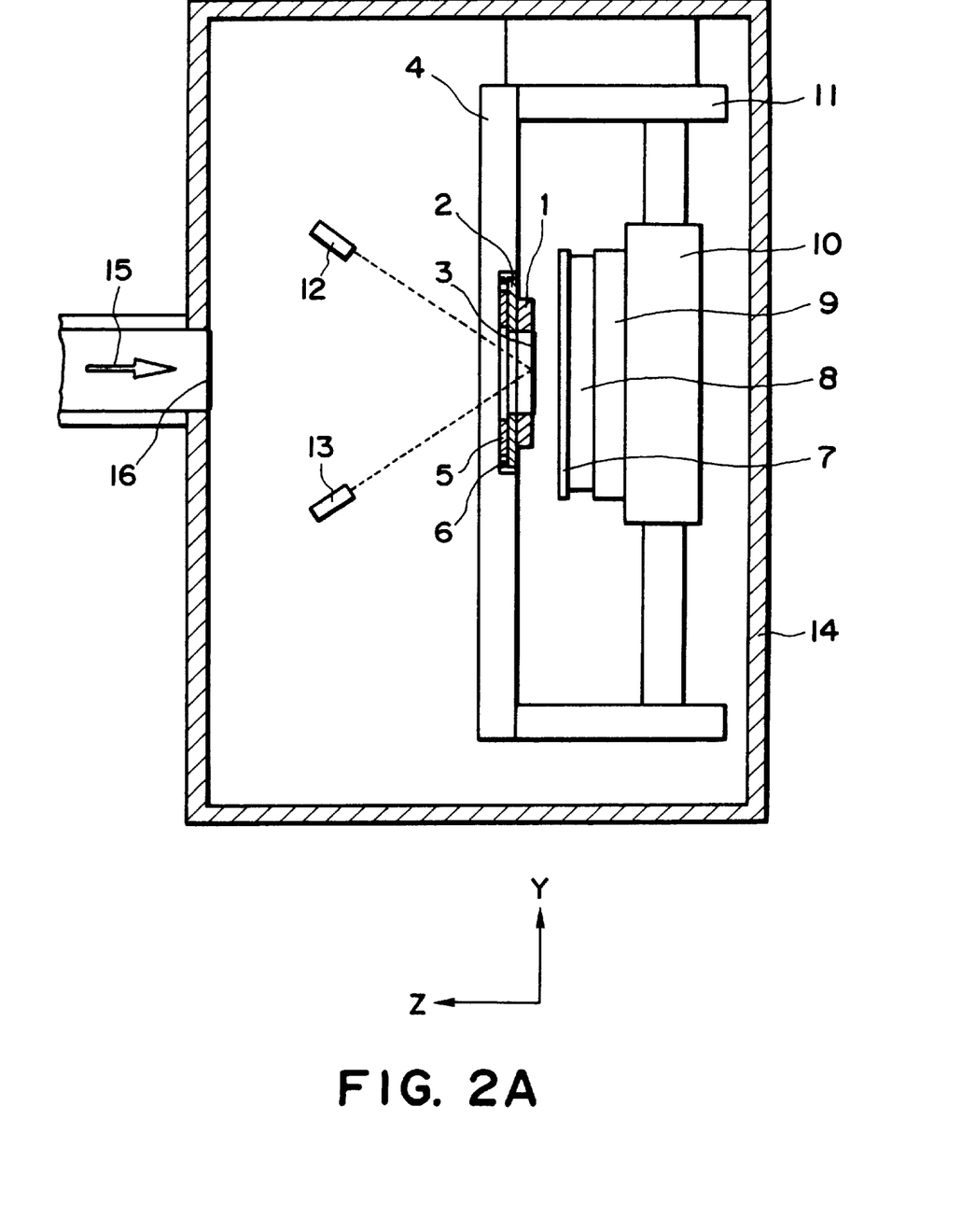
FIG. 2A is a schematic view for explaining the structure of an exposure apparatus according to a first embodiment of the present invention.

Preferred embodiments of the present invention will be described in conjunction with the drawings.
First Embodiment
Description of Apparatus Structure FIG. 2A shows the structure of an X-ray exposure apparatus according to a first embodiment of the present invention. Denoted in the drawing at 1 is a mask, and denoted at 2 is a mask chuck for holding the mask. Denoted at 3 is a mask membrane, and denoted at 4 is a mask chuck base. Denoted at 5 is a task Z-tilt stage, and denoted at 6 is an electrostatic capacitance sensor for measuring the attitude of the mask. The mask 1 and the mask chuck 2. are mounted on the mask Z-tilt stage 5, while the mask Z-tilt stage 5 and the electrostatic capacitance sensor 6 are mounted on the mask chuck base 4. The mask Z-tilt stage 5 is provided with driving actuator means which comprises three piezoelectric devices mounted. Denoted at 7 is a wafer, and denoted at 8 is a wafer chuck for holding the wafer. Denoted at 9 is a fine-motion stage to be used for alignment between the mask and the wafer. Denoted at 10 is a rough-motion stage to be used for movement for changing shots. Denoted at 11 is a stage base with which the guiding of the rough-motion stage is fixed. The wafer 7 and the water chuck 8 are mounted on the fine-motion stage 9.

Denoted at 12 is a light projecting portion of a light sensor, and denoted at 13 is a light receiving portion of the light sensor. In this embodiment, these elements constitute a sensor for directly measuring deformation of the mask membrane in accordance with an essential feature of the present invention.

The structure described above as a whole is placed within a chamber 14, and it is maintained within a reduced pressure helium gas ambience during the exposure process. Synchrotron radiation light 15 produced by a light source (not shown) is directed through a blocking window 16 (usually a Be window) into the chamber 14.

In this embodiment, the mask Z-tilt stage 5 has actuator means of three piezoelectric devices mounted thereon, for moving the attitude of the mask 1. However, the actuator or the number of actuator elements may be changed, provided that the attitude of the mask 1 can be adjusted thereby. Further, while the electrostatic capacitance sensor 6 is provided and mounted on the mask chuck base 4 as a mask attitude sensor, the sensor or the number of sensor elements may be changed.

Next, the manner of measuring mask membrane deformation and mask attitude control according to an essential feature of the present invention will be explained.

Mask Membrane Deformation Measurement

Displacement of the center of the mask membrane 3 is directly measured by use of the light projecting portion 12 and light receiving portion 13 of the light sensor. The light projecting portion 12 and the light receiving portion 13 of the light sensor are placed at positions not interfering with the exposure process, and light projection and light reception are performed in accordance with an oblique incidence method.

In this embodiment, deformation at the center of the mask membrane 3 can be directly measured. However, the measurement position is not limited to the center, provided that a measurement error produced as a result of attitude of the mask membrane 3 due to deformation is corrected.

Mask Attitude Control

In this embodiment, in order to assure that deformation of the mask membrane 3 does not exceed the tolerance width of an exposure gap during stepwise motion of the rough-motion stage 10, the amount of deformation and the direction of deformation of the mask membrane 3 are fed back to the mask attitude drive, in accordance with the direction of stepwise motion of the rough-motion stage 10. The mask attitude drive is executed so that the center of the mask membrane 3 serves as a rotational center.

Figure 2B:
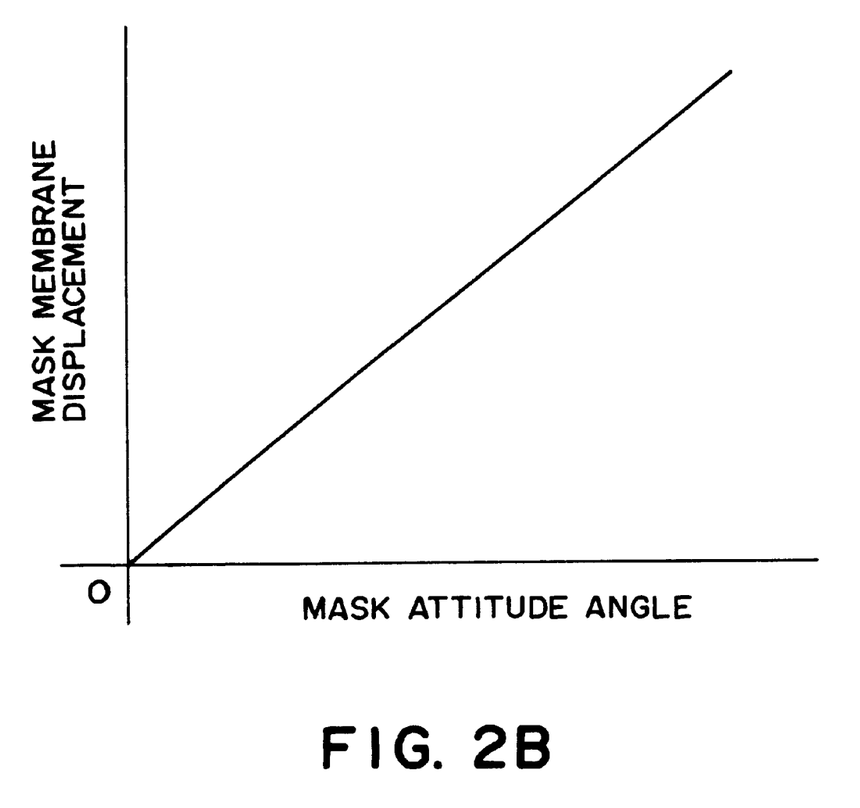
FIG. 2B is a graph for explaining superiority of mask attitude control for suppressing mask membrane deformation, according to the first embodiment of the present invention.

The reason for feeding back the mask membrane 3 deformation to the mask attitude drive is because the mask membrane 3 deformation changes linearly with respect to the mask attitude angle. FIG. 2B shows the relation between the mask membrane 3 deformation (displacement of center) and the mask attitude (the angle with respect to the stepwise direction). Further, the reason for using information related to the stepwise driving direction of the wafer stage 10 is because the direction of deformation of the mask membrane 3 varies with the stepwise driving direction. Namely, if the mask-to-wafer gap reduces in the wafer driving direction, the membrane will be deformed in a direction away from the wafer. If, on the other hand, the gap increases in the wafer driving direction, the membrane will be deformed in a direction close to the wafer. Thus, on the basis of the direction of membrane deformation, whether the gap reduces or increases along the stepwise movement direction can be discriminated. Then, the mask attitude angle is adjusted in the direction effective to correct such relative tilt, and by an angle corresponding to the amount of deformation.

Further, the reason for driving the mask attitude by rotating the center of the mask membrane as a rotational center is to maintain constant the spacing or gap (average gap at the exposure region) between the wafer 7 and the mask 1. If the gap can be held constant, the mask attitude drive may not be performed with respect to the rotational center of mask membrane 3.

Although in this embodiment the deformation of mask membrane 3 is fed back to mask attitude driving, it may be fed back to wafer attitude driving or to both of the mask attitude driving and wafer attitude driving.

Figure 3:
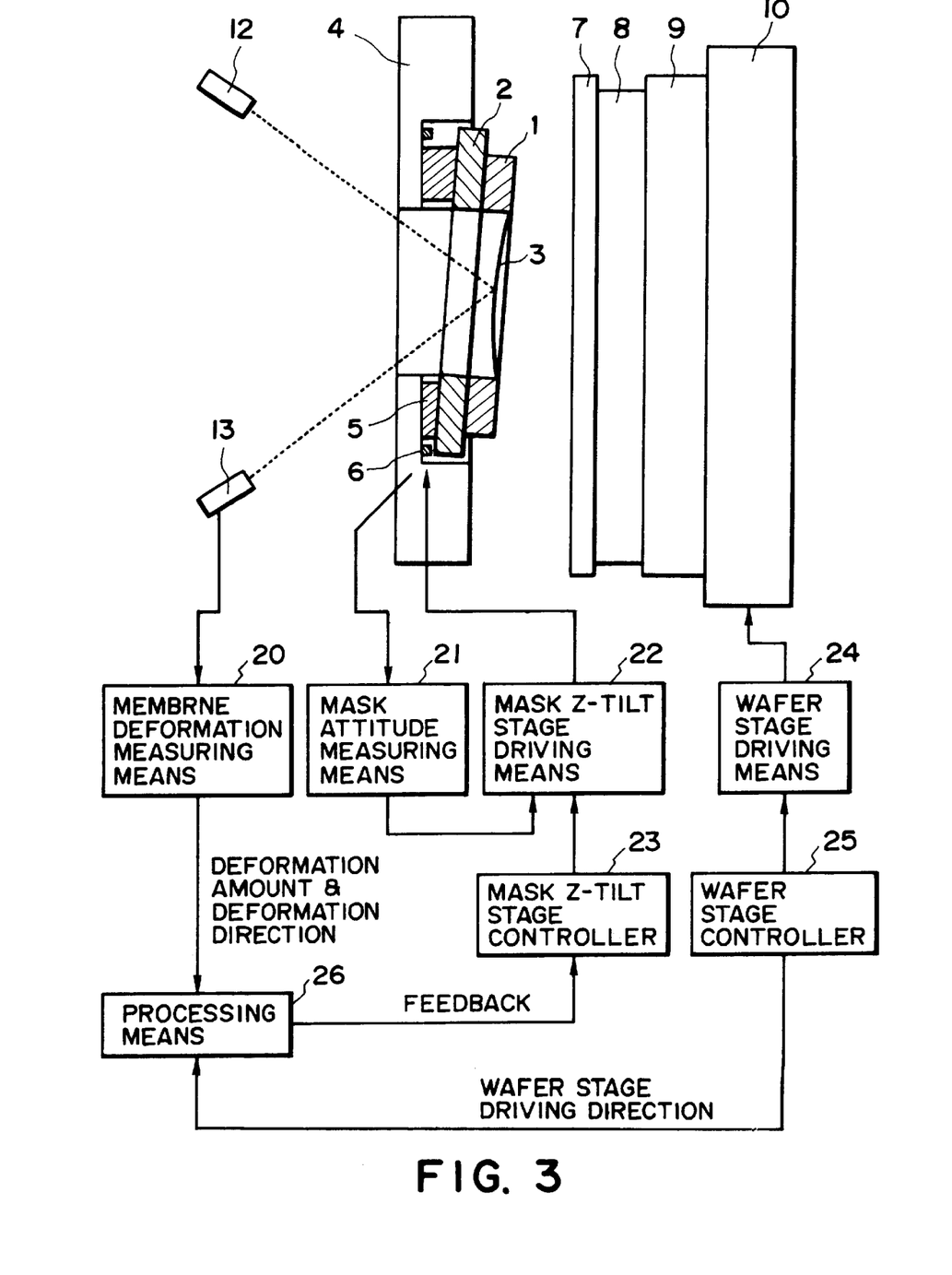
FIG. 3 is a schematic and diagrammatic view fur explaining mask membrane deformation measurement and mask attitude control, according to the first embodiment of the present invention.

FIG. 3 is a schematic and diagrammatic view for explaining mask membrane deformation measurement and mask attitude control. Denoted at 20 is measuring means for measuring membrane deformation on the basis of a signal from the light receiving portion 13. Denoted at 21 is measuring means for measuring mask attitude on the basis of a signal from the sensor 6. Denoted at 22 is driving means for moving the mask Z-tilt stage 5, and denoted at 23 is a controller for controlling the mask Z-tilt stage through the driving means 22. Denoted at 24 is driving means for the wafer stage 10, and denoted at 25 is a controller for the wafer stage 10. Denoted at 26 is processing means for performing signal processing for the feedback control for mask attitude control.

Exposure Procedure

Figure 4:
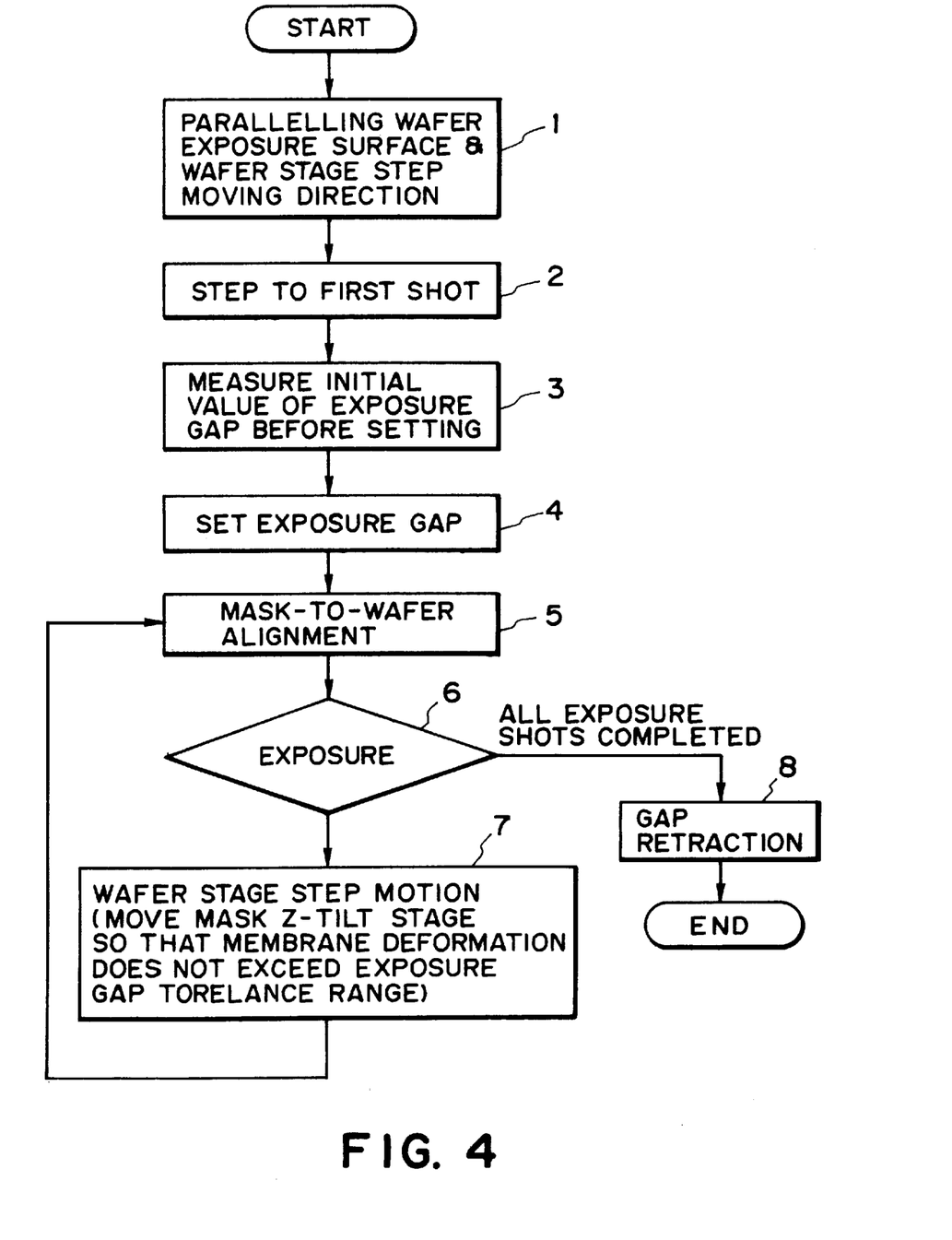
FIG. 4 is a flow chart for explaining the exposure procedure according to the first embodiment of the present invention.

The exposure procedure to be made in the first embodiment, in accordance with the die-by-die method, will be explained below. FIG. 4 is a flow chart showing the procedure in general.

Step 1: The degree of parallelism of the surface of the wafer 7, to be exposed, as the rough-motion stage 10 is moved stepwise, is measured by use of a gap sensor (not shown) mounted on the mask chuck base 4. Then, parallelization of the wafer 7 surface with respect to the stepwise movement direction of the rough-motion stage 10 is carried out.

Step 2: The rough-motion stage 10 is moved stepwise so that a portion of the wafer 7 for exposure of the first shot is placed opposed to the mask 1. Here, in order to prevent interference between the wafer 7 and the mask 1, the gap for stepwise motion is set at a sufficiently large value while taking into account the parallelism of the mask and wafer. In this embodiment, it is set at not less than 100 microns.

Step 3: While using an alignment scope (not shown), Z drive of the fine-motion stage 9 is carried out up to the gap value for the gap measurement (autofocus measurement). Then, the autofocus measurement is executed. The alignment scope has two measurement functions for positional deviation measurement (autoalignment measurement) and gap measurement (autofocus measurement), and it is mounted on a dual-axis stage so that it can follow any shift of the position of an alignment mark or marks of the mask 1.

Step 4: On the basis of the result of autofocus measurement through the alignment scope, the fine-motion stage 9 is driven to orient parallel the mask 1 and the wafer 7. After this, the stage is moved for setting the gap (30 microns) for autoalignment measurement with respect to directions along the surface of the mask 1 and wafer 7.

Step 5: By using the alignment scope, the autoalignment measurement is performed and, by using the fine-motion stage 9, the mask 1 and the wafer 7 are brought into alignment with each other.

Step 6: Exposure operation is performed. If exposures of all shots are completed, the operation at Step 8 is carried out.

Step 7: After the exposure operation, the rough-motion stage 10 is moved stepwise for a subsequent shot position. In order to assure that during stepwise motion the amount of deformation of the mask membrane 3 does not exceed the exposure gap tolerance width, the amount of deformation of the mask membrane 3 is real-time fed back in accordance with the stepwise movement direction, and the mask Z-tilt stage 5 is attitude controlled. After completion of stepwise motion of the rough-motion stage 10, the operations of Step 5 to Step 7 are repeated.

Step 8: After all the shots are completed, the stage is retraced back to the gap of 100 microns.

Although the above embodiment has been described with reference to a sequence wherein the exposure gap is 30 microns and the retracted gap is 100 microns, the concept is similarly applicable even when these values are changed.

Advantageous Effects of the First Embodiment

In accordance with the first embodiment, mask membrane deformation can be suppressed within the tolerance width or range of exposure gap. Thus, there is no necessity of retracting a wafer to a wider gap position and, therefore, a wafer stage can be driven at a higher speed. As a consequence, the mask-to-wafer alignment precision as well as the transfer precision can be made higher. Since there is no necessity of gap changing between a gap for stepwise motion and a gap for exposure, and there is no necessity of a delay for waiting attenuation of the mask membrane, the throughput is improved significantly.

With the attitude drive of the mask, the center of attitude rotation is held constant. Thus, independently of the wafer stage position, the same procedure can be done for the control.

As a result of real-time control, there is no unnecessary measurement time and thus the throughput is improved.

Second Embodiment

Figure 5:
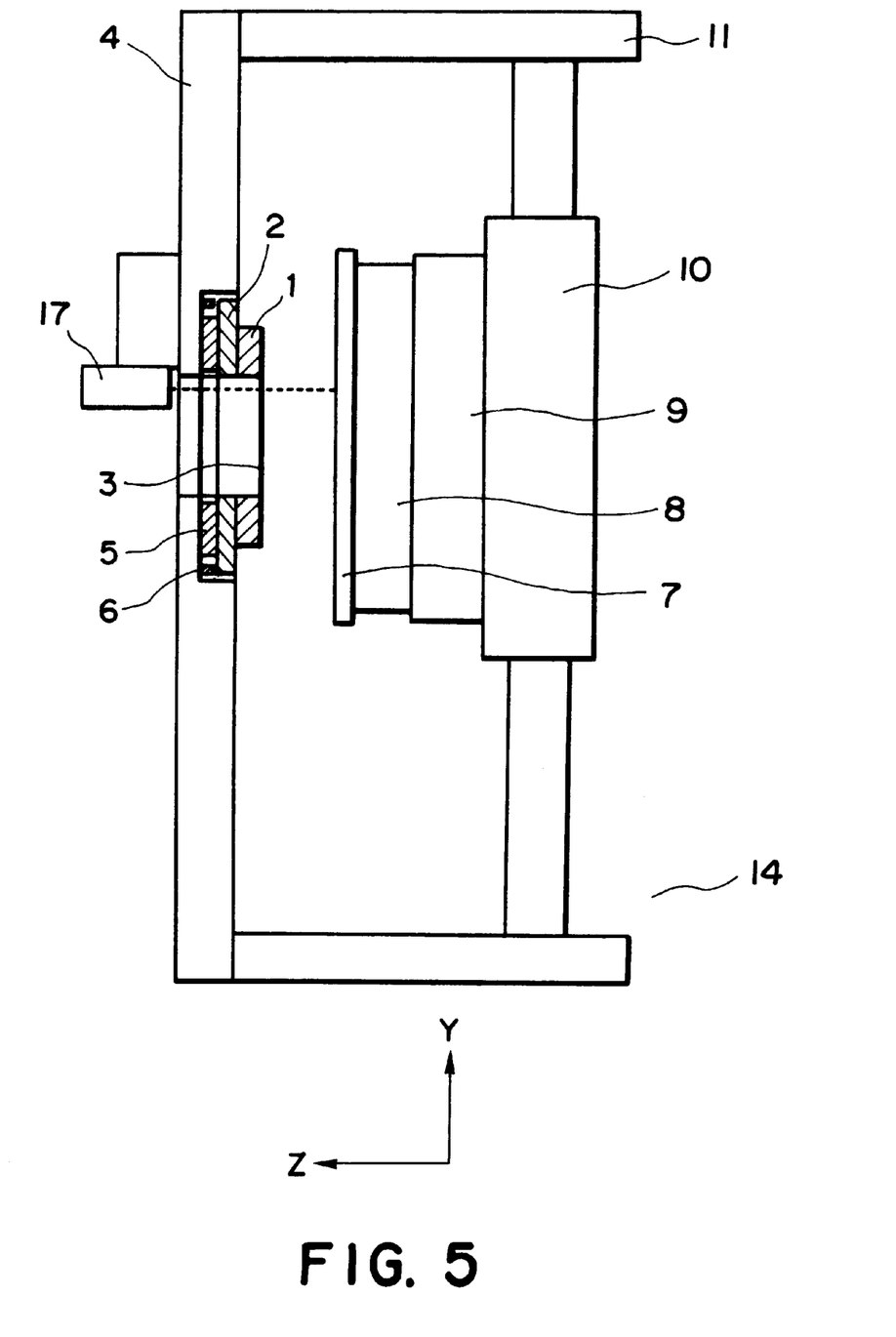
FIG. 5 is a schematic view for explaining the structure of an exposure apparatus according to a second embodiment of the present invention.

FIG. 5 shows the structure of an X-ray exposure apparatus according to a second embodiment of the present invention. The second embodiment does not use any exclusive sensor for measurement of mask membrane deformation.

Description of Apparatus Structure

Denoted in FIG. 5 at 1 is a mask, and denoted at 2 is a mask chuck for holding the mask. Denoted at 3 is a mask membrane, and denoted at 4 is a mask chuck base. Denoted at 5 is a mask Z-tilt stage, and denoted at 6 is an electrostatic capacitance sensor for measuring the attitude of the mask. The mask 1 and the mask chuck 2 are mounted on the mask Z-tilt stage 5, while the mask Z-tilt stage 5 and the electrostatic capacitance sensor 6 are mounted on the mask chuck base 4. The mask Z-tilt stage 5 is provided with driving actuator means which comprises three piezoelectric devices mounted. Denoted at 7 is a wafer, and denoted at 8 is a wafer chucks for holding the water. Denoted at 9 is a fine-motion stage to be used for alignment between the mask and the wafer. Denoted at 10 is a rough-motion stage to be used for movement for changing shots. Denoted at 11 is a stage base with which the guiding of the rough-motion stage is fixed. The wafer 7 and the wafer chuck 8 are mounted on the fine-motion stage 9.

Denoted at 17 is an alignment scope which has functions for positional deviation measurement and gap measurement. It is mounted on a dual-axis stage so that it can follow any shift of the position of an alignment mark or marks of the mask 1. In this embodiment, the alignment scope 17 is used also as a sensor for measuring deformation of the mask membrane.

Measurement of Mask Membrane Deformation

The manner of measuring deformation of the mask membrane 3 in accordance with an essential feature of the present invention will be explained below.

As described above, the alignment scope 17 has a gap measuring function. If it is assumed, from the results of flatness measurement to the wafer 7 prior to the exposure process, that warp or waving of the wafer 7 is so small that it can be disregarded, then deformation of the mask membrane 3 can be determined as follow:

(mask membrane deformation)=(autofocus measured value)−(set gap),

If wafer warp or waving is large, during the stepwise motion of the rough-motion stage 10, Z drive of the fine-motion stage 9 may be performed on the basis of the result of flatness measurement described above and in synchronism with the wafer warp or waving, and the stepwise motion of the rough-motion stage 10 may be done so as not to change the set gap. Then, deformation of the mask membrane 3 can be determined in accordance with the above-described equation.

Advantageous Effects of the Second Embodiment

In accordance with the second embodiment, in addition to the advantageous effects of the first embodiment, there is an advantage of good space efficiency because there is no sensor used exclusively for measuring deformation.

While the above-described embodiments have been explained with reference to examples wherein the exposure process is carried out in accordance with the die-by-die method, the present invention is applicable also to a global method.

The stepwise motion is not limited to the stepwise motion at the exposure gap. It is applicable to all stepwise motions in a state where a mask and a wafer are disposed opposed to each other.

The manner of measuring mask membrane deformation is not limited to the examples described with reference to the above embodiments. An alternative example may be that the relation between a pressure variation, between the mask membrane 3 and the wafer 7, and the amount of mask membrane deformation is used. Namely, a pressure sensor may be provided between the mask membrane 3 and the wafer 7, and attitude control may be performed on the basis of an output of this sensor.

Further, the above-described embodiments are based on an assumption that the mask membrane deformation varies linearly with the mask attitude angle and, for that reason, the angle of the mask with respect to the stepwise movement direction is controlled in accordance with the shift of the center of the mask membrane 3. However, appropriate evaluation means for evaluating the relation between mask membrane deformation and mask attitude may be provided, and the method of attitude drive for at least one of the mask and the wafer may be determined on the basis of the evaluation means. An example of such evaluation means may be one wherein the relation between the mask membrane deformation and the mask attitude is detected beforehand, and a formula corresponding to that relation may be memorized. The attitude drive method may be based on a basic formula with which the drive control through the processing means 26 is performed.

Next, an embodiment of a device manufacturing method which uses an exposure apparatus or exposure method such as described hereinbefore, will be explained.

Figure 6:
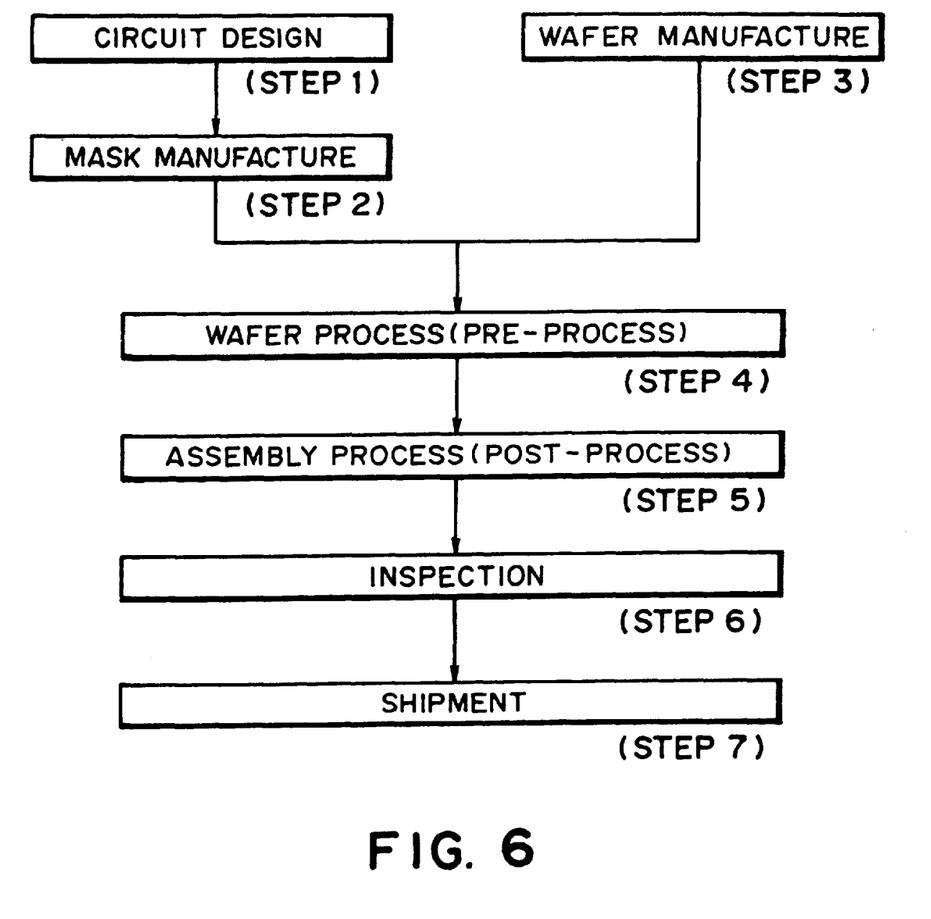
FIG. 6 is a flow chart of microdevice manufacturing processes.

FIG. 6 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 7:
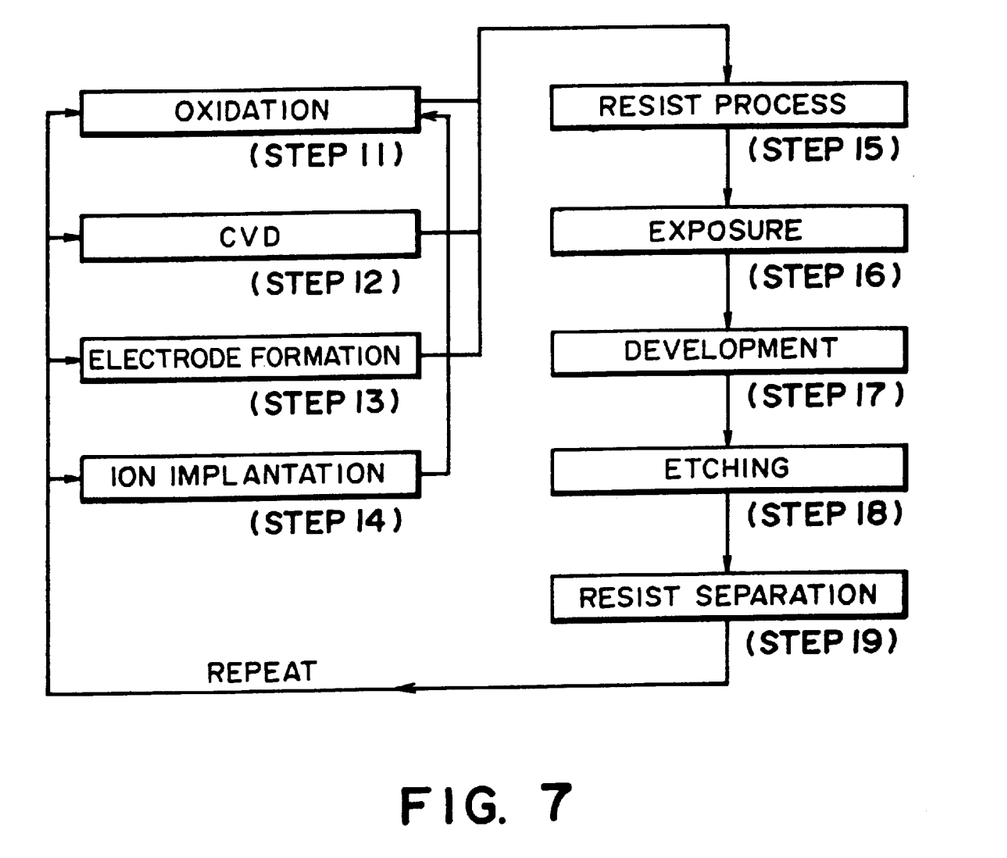
FIG. 7 is a flow chart for explaining details of a wafer process in the procedure of FIG. 6.

FIG. 7 is a flow chart showing details of the wafer process. Step 11 is an oxidation process for oxidizing the surface of a wafer. Step 12 is a CVD process for forming an insulating film on the water surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured with low cost.

In accordance with the embodiments of the present invention having been described hereinbefore, deformation of a mask membrane during stepwise motion of a stage can be suppressed to be not greater than a predetermined value, such that mask-to-wafer alignment precision as well as transfer precision can be increased. Also, since there is no necessity of a delay for waiting for attenuation of mask membranes deformation, the throughput can be made larger.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for transferring a pattern, formed on a membrane of a mask, to an exposure region of a wafer disposed opposed to the mask with a small spacing kept therebetween, said apparatus comprising:

exposure means for transferring, by exposure, the pattern of the mask to different exposure regions of the wafer sequentially;

measuring means for producing deformation information related to at least one portion of the mask membrane; and attitude controlling means for controlling attitude of at least one of the mask and the wafer, on the basis of the deformation information produced by said measuring means.

2. An apparatus according to claim 1, further comprising a wafer stage for moving the wafer stepwise to allow transfer of the pattern to different exposure regions on the wafer, wherein said attitude controlling means controls the attitude of at least one of the mask and the wafer in accordance with the deformation information about the mask membrane, and by using drive information related to the stepwise motion of the wafer stage.

3. An apparatus according to claim 2, wherein the spacing between the mask and the wafer at the stepwise motion is substantially equal to a spacing between the mask and the wafer during the exposure process to be performed with said exposure means.

4. An apparatus according to claim 1, wherein said measuring means includes a displacement gauge for measuring deformation of at least one portion of the mask membrane without contact thereto.

5. An apparatus according to claim 1, wherein said attitude controlling means includes means for evaluating a relation between the drive information and deformation of the mask membrane, wherein said attitude controlling means determines attitude control for at least one of the mask and the wafer on the basis of the evaluation.

6. An apparatus according to claim 5, wherein said attitude controlling means controls the attitude of the mask in accordance with the attitude control as determined on the basis of the evaluation, and in accordance with deformation information about the mask membrane as produced by said measuring means.

7. A method of manufacturing an electronic device, comprising the steps of:

placing a mask with a membrane and a wafer opposed to each other with a small gap kept therebetween;

detecting information about deformation of at least a portion of the mask membrane;

controlling attitude of at least one of the mask and the wafer on the basis of the deformation information;

transferring, by exposure, a pattern formed on the mask membrane to different exposure regions on the wafer sequentially; and finishing electronic devices by using the patterns transferred to the wafer.

* * * * *

UNITED STATES PATENT AND TRADEMARK OFFICE
CERTIFICATE OF CORRECTION

PATENT NO. : 5,959,304

DATED : September 28, 1999

INVENTORS : TOSHINOBU TOKITA, ET AL.                Page 1 of 2

It is certified that error appears in the above-identified patent and that said Letters Patent is hereby corrected as shown below:

IN THE DRAWINGS:

In sheet 4, FIG. 3, in logic block 20,
"MEMBRNE" should read --MEMBRANE--; and

In sheet 5, FIG. 4, in logic block 7,
"TORELANCE" should read --TOLERANCE--.

IN THE DISCLOSURE:

COLUMN 1:
Line 54, "paralelling" should read --paralleling,--.

COLUMN 2:
Line 40, "fur" should read --for--.

COLUMN 3:
Line 13, "water" should read --wafer--.

UNITED STATES PATENT AND TRADEMARK OFFICE
CERTIFICATE OF CORRECTION

PATENT NO. : 5,959,304

DATED : September 28, 1999

INVENTORS : TOSHINOBU TOKITA, ET AL.

It is certified that error appears in the above-identified patent and that said Letters Patent is hereby corrected as shown below:

COLUMN 5:
Line 67, "chucks" should read --chuck-- and "water." should read --wafer.--.

COLUMN 6:
Line 23, "follow:" should read --follows:--; and
Line 25, "gap)," should read --gap).--.

Signed and Sealed this

Eighth Day of August, 2000

Attest:

Q. TODD DICKINSON

Attesting Officer

Director of Patents and Trademarks